United States Patent [19]

Davis

[11] Patent Number: 4,686,461

[45] Date of Patent: Aug. 11, 1987

[54] AUXILIARY EQUIPMENT MOUNTING RING FOR ELECTRIC METER

[75] Inventor: Steven B. Davis, St. Mathews Twp., Knightdale Co., N.C.

[73] Assignee: Westinghouse Electric Corp., Pittsburgh, Pa.

[21] Appl. No.: 630,034

[22] Filed: Jul. 12, 1984

[51] Int. Cl.$^4$ ............................ G01R 1/04; H02B 9/00
[52] U.S. Cl. .................................. 324/157; 324/156; 361/369
[58] Field of Search ................... 324/110, 103 R, 157, 324/156, 116; 361/364, 369, 370, 371

[56] References Cited

U.S. PATENT DOCUMENTS

| | | | |
|---|---|---|---|
| 2,147,895 | 2/1939 | Hamill | 324/103 R |
| 3,143,704 | 8/1964 | Wright | 324/155 |
| 3,178,110 | 4/1965 | Knecht et al. | |
| 3,309,152 | 3/1964 | Ramsey et al. | |
| 3,413,550 | 11/1968 | Wright | 324/152 |
| 3,913,014 | 10/1975 | Halstead | 324/103 R |
| 3,943,498 | 3/1976 | McClelland et al. | 346/14 M R |
| 4,034,292 | 7/1977 | McClelland | 324/157 |
| 4,047,024 | 9/1977 | Henderson | |
| 4,081,746 | 3/1978 | Snyder et al. | 324/116 |
| 4,156,184 | 5/1979 | Benbow | 324/103 R |
| 4,307,341 | 12/1981 | Benbow et al. | 324/103 R |
| 4,491,789 | 1/1985 | Benbow | 324/157 |

*Primary Examiner*—Ernest F. Karlsen
*Attorney, Agent, or Firm*—B. R. Studebaker

[57] ABSTRACT

A support structure is provided that enables an existing kilowatt-hour meter to be updated with additional auxiliary electronic components. The support structure comprises a base ring that is shaped to be received within a circular slot of an existing kilowatt-hour meter and latches are provided that lock the base ring between the existing base portion of a kilowatt-hour meter and its frame. A plurality of support plates are attached to the base ring by a plurality of posts. The base ring and posts are disposed in a radial pattern about the central axis of symmetry of the base ring in such a way so as to permit the support structure to pass over and extend beyond the existing components of the original kilowatt-hour meter. Electrical connection between existing meter components and auxiliary electronic components is provided by flexible ribbon connectors, cables or individual conductors and an elongated cover is used to provide protection of both the original kilowatt-hour meter and the auxiliary components.

9 Claims, 9 Drawing Figures

AUXILIARY EQUIPMENT MOUNTING RING FOR ELECTRIC METER

BACKGROUND AND SUMMARY OF THE INVENTION

The present invention relates generally to electric utility apparatus and, more particularly, to an apparatus for modifying an existing electric equipment to incorporate additional auxiliary components.

Electric meters and other wall-mounted electrical equipment have been used for many years by electric utility companies and others to measure the energy consumption of their customers or to perform other functions. The various types of wall mounted electrical equipment includes kilowatt-hour meters, load management terminals, transponders and other equipment related to either the measurement of electric energy consumption or power line communications equipment. In its simplest form, a kilowatt-hour meter incorporates an energy measurement apparatus that is responsive to the consumption of electrical energy and a registering device that is able to visually indicate or electrically communicate the cumulative consumption of the measured quantity. The registering device which is generally a dial indicator register, a cyclometer register or an electronic register, enables the consumer or a meter reader to visually determine the accumulated kilowatt-hours of energy consumption used by the consumer at whose location the electrical meter is located. Typical kilowatt-hour meters that are known to those skilled in the art utilize a rotatable disk that rotates in response to electrical energy consumption. The rotatable disk revolves about an axis that is appropriately coupled, through a plurality of gears and shafts, to a register.

The most commonly used type of register used with an electric utility meter typically comprises a plurality of shafts with each shaft connected to a dial indicator, or pointer. The shafts extend through holes in a faceplate of the register and the faceplate is provided with indicia that enables a visual determination of the numeric values corresponding to the positions of each dial. The register's shafts are typically associated in a decade relationship so that the cumulative energy consumption can be readily observed from the positions of the dial indicators with respect to their associated indicia. U.S. Pat. No. 3,178,110 which issued to Knecht et al. on Apr. 13, 1965 discloses a meter register. Many other types of registers are known to those skilled in the art. For example, cyclometer registers incorporate a plurality of drums on which numerical indicia are imposed. The indicia drums rotate in response to electrical energy usage and the cumulative value of consumption at any time can be read directly from the front portion of the register. Also, electronic registers can be used in conjunction with kilowatt hour meters. These registers provide digital representations of cumulative electrical energy usage by being operatively associated with a pulse counting device and related electronic circuitry.

In recent years, many technological advances have occurred in the field of electrical metering. For example, time-of-use (TOU) meters have been developed that enable an electric utility to incorporate a multirate billing system that varies as a function of the time of day or day of the year when the electrical energy is consumed. A multiple rate meter is disclosed in U.S. Pat. No. 4,081,746 which issued to Snyder et al. on Mar. 28, 1978 and an improved clutch mechanism for time of day registers is disclosed in U.S. Pat. No. 4,307,341 which issued to Benbow et al. on Dec. 22, 1981. Furthermore, demand meters have been developed that measure the consumer's electrical power demands over predetermined periods of time during the building period. A demand meter is disclosed in U.S. Pat. No. 3,913,014, which issued to Halstead on Oct. 14, 1975 and an on-peak watt-hour demand meter with disc loading compensation is disclosed in U.S. Pat. No. 4,156,184, which issued to Benbow on May 22, 1979.

Besides kilowatt-hour meters, many other types of electrical equipment are used by electrical utilities. For example, load management terminals can be located at a consumer's residence for the purpose of load shedding during periods of peak demand. In a typical system of this type, the electric utility would send modulated signals to particular load management terminals that command the terminals to shed specific non-essential loads at the customer's residence. Some load management terminals only have the ability to receive signals which are transmitted on the power line and to respond to commands received in this manner from a central location. Other load management terminals also have the capability of both transmitting and receiving power line communication signals. This capability permits the load management terminal to not only respond to commands received from a central utility location, but also to transmit data from the consumer's residence to a central location. This data would typically comprise meter reading data or other status-related signals.

Many recent developments in the field of electrical measurement and powerline communications in recent years relate to the increased use of electronic circuitry within the kilowatt-hour meter. The use of solid state components and microprocessors within electric equipment, such as meters or load management terminals, is rapidly becoming common place. The use of microprocessors, or microcomputers, within these types of electrical equipment vastly increases its capabilities and expands the type of information that it can provide to both the electric utility and the consumer. For example, in order to display the many types of numeric information that can be provided by a kilowatt-hour meter, electronic registers have been developed. These electronic registers display data on an alphameric panel which is able to sequentially display a plurality of values, whereas a mechanical register requires a single dial indicator and associated shaft for every digit of a measured quantity. Microprocessor permit electrical equipment, which is located at a consumer's residence, to perform complex demodulation and modulation of powerline communication signals, accurately read the meter and perform load shedding operations.

When an electric utility desires to upgrade its metering or load control capability, it faces a potentially expensive procedure. For each conventional kilowatt-hour meter that is replaced by a more sophisticated meter, the utility must not only consider the additional cost for the more technologically advanced meter, but also the potential loss due to their increased inventory of the unused meters. When a conventional watt-hour meter is replaced by a more sophisticated meter, some of the capabilities of the simpler meter are necessarily reproduced in the new meter. This represents an unnecessary expense because a portion of the cost for the new meter relates to replacement of components that were part of the replaced meter.

Therefore, when an electric utility replaces an existing electrical apparatus with a more complicated and technologically advanced device, a portion of the incurred expense represents the replacement of existing components with redundant components in the new device. It would therefore be economically advantageous if an existing apparatus, such as a watt-hour meter, could be upgraded without the need to replace its existing components that would also be required in the new meter. For example, if a meter could be upgrade by merely adding axiliary equipment, significant savings could be realized.

The present invention will be described in terms of its particular application to a kilowatt hour meter. However, it should be understood that alternative embodiments of the present invention could also be used to provide a means for attaching and supporting auxiliary components to existing electrical apparatus. The support structure of the present invention could be used, for example, in association with kilowatt hour meters, load management terminals, metering and control transponders, and many other types of wall-mounted electrical apparatus that is commonly used by electrical utility companies. Furthermore, although a particular embodiment of the present invention utilizes a ring-shaped base as it means for attaching the support structure to the base of the electrical apparatus, it should be understood that various other shapes of the attachment means can be used. Also, the ring-shaped base of the support structure is described as being attachable to the base by means of a plurality of latches. It should be understood that many alternative attaching means, such as screws, are also within the scope of the present invention. For convenience, the present invention is described herein in terms of a particular embodiment that is applicable for use in association with kilowatt hour meters.

The present invention relates to an apparatus for upgrading existing electrical apparatus, such as meters, with auxiliary electronic equipment. It comprises a support structure that has an attachment means, such as a base ring, shaped to fit into the base of the electrical apparatus in rotatable association therewith. Many existing meter bases have a pair of molded rings in their bases. These rings, or functionally similar configurations, cooperate with a gsket in order to provide an effective seal between the cover and the base of a kilowatt-hour meter. When applied in association with a kilowatt hour meter that has a base with molded rings, the base ring of the present invention is shaped to fit with the molded rings in such a way so as to prevent relative motion in all directions except in the direction of rotation about the central axis of symmetry of both the base ring and the molded rings of the meter's base.

The base ring of the present invention is provided with a plurality of latches that are rotatably connected to it. Each of the latches, when rotated about their individual centers of rotation, move their latch portions radically inward in such a way so as to abut a portion of the meter structure. When the latches are rotated about their individual axes of rotation, they prevent the base ring from rotating about its central axis of symmetry because they abut components of the meter base structure. They also are engaged between the base ring and a frame portion of the meter structure. Therefore, the base ring is attached to the meter base in such a way so as to prevent its rotation about its central axis symmetry and its movement in a direction away from the meter base. It should be understood that, although these latches provide a convenient way of attaching the support structure of the present invention to the apparatus, alternative methods of attachment are also possible. For example, the base ring could be screwed or bolted to the meter base.

The base ring of the present invention is provided with a plurality of posts that are attached to it and extend in a direction away from the meter's base. Each of the posts has one of its ends attached to the base ring and extends in a direction which is generally parallel to the central axis of symmetry of the base ring. These posts are used to support one or more support plates. Each mounting plate is attached to the posts in such a way so as to hold the mounting plate in a configuration which is generally perpendicular to the central axis of symmetry of the base ring. The primary function of the posts is to support the support plates at a position which extends beyond the original components of the meter. This enables additional electrical devices to be attached to the support plates in a position which does not interfere with the components of the original meter. It should be understood that the support plates would normally comprise a combination of plates, brackets and circuit boards.

The support plates of the present invention can be provided with an opening that is generally aligned with the indicia portion of the register's front plate when the present invention is attached to a meter. The dial indicators of the register and the opening in the support plates are aligned along a line that is generally parallel to the central axis of symmetry of the base ring. Since the mechanical register of a typical kilowatt-hour meter is generally disposed in a configuration that is readily visible in a direction perpendicular to the base of the meter, the openings in the support plates of the present invention permit visual observation of the dial indicators through the support plate structure. Of course, it should be understood that the openings in the support plates are not required if no visual register is to be disposed behind them. In applications of the present invention that relate to load management terminals, transponders or other electrical apparatus which does not utilize a manually readable register, the support plates of the present invention can be incorporated without the use of these openings.

Besides supporting a plurality of electronic devices, the support plates of the present invention are also able to provide support for an additional electronic register that can be added, as auxiliary equipment, to an existing kilowatt-hour meter. When an electronic register is used in accordance with the present invention, a pulse initiator is attached to the frame of the existing meter and a flexible conductor is used to provide electrical communications between the pulse initiator and the electronic register. Of course, it should be understood that the present invention is applicable with many different types of electrical apparatus. In some applications, the pulse initiator may be mounted on a remote meter and the signals form the pulse initiator are communicated to the electrical apparatus comprising the present invention along signal wires. This would be a typical application in situations where the present invention is used in conjunction with load management terminals, either pluggable or surface mounted, which do not contain their own meters. Various types of pulse initiators are known to those skilled in the art. A photoelectric pulse initiator is disclosed in U.S. Pat. No.

4,047,024, which issued to Henderson on Sept. 6, 1977. A direction sensitive opto-electronic pulse initiator for electrical meters is disclosed in U.S. Pat. No. 4,034,292, which issued to McClelland on July 5, 1977 and a direct input photoelectric pulse initiator for meter telemetry and recording systems is disclosed in U.S. Pat. No. 3,943,498, which issued to McClelland et al. on Mar. 9, 1976. Furthermore, flexible conductors are used to provide electrical communication between the existing portions of the original meter and the additional electronic components attached to the support plates.

The radial and longitudinal dimensions of the support structure of the present invention permit a cover to fit over the support structure and be attached to the base of the meter. Although the cover of the present invention is generally larger, in a longitudinal direction, than the original cover used by the existing watt-hour meter, its radial dimensions remain generally the same. The increased longitudinal dimension of the meter cover is related to the additional electronic equipment supported by the support plates and posts of the present invention. The cover generally has a transparent portion disposed in alignment with the opening of the support plates and the indicia that are associated with the dial indicators of the mechanical register. This permits and observer to view the dial indicators of the mechanical register, or the display of an electronic register, by looking along a line of sight through the transparent portion of the meter cover, the openings in the support plates and the indicia portion of the faceplate on the mechanical register. Of course, it should be understood that, in many cases, the entire cover is transparent. Furthermore, in some applications it is beneficial to use a generally transparent cover with portions of the cover being painted in order to interfere with solar heat that would normally pass through the transparent cover and disadvantageously raise the temperature within the electrical apparatus.

It should be understood that an electrical apparatus, such as a kilowatt-hour meter, made in accordance with the present invention can incorporate electronic components that are related to many different capabilities that are provided by auxiliary equipment added to the existing apparatus. The electronic components which are supported by the support plates of the present invention can provide demand metering capabilities, time of use metering, electronic registering capabilities, load control of external devices or any additional equipment that is used to upgrade existing electrical devices.

BRIEF DESCRIPTION OF THE DRAWING

The present invention will be more fully understood for reading of the description of the preferred embodiment in conjunction with the drawing, in which.

DESCRIPTION OF THE PREFERRED EMBODIMENT

Figure 1:
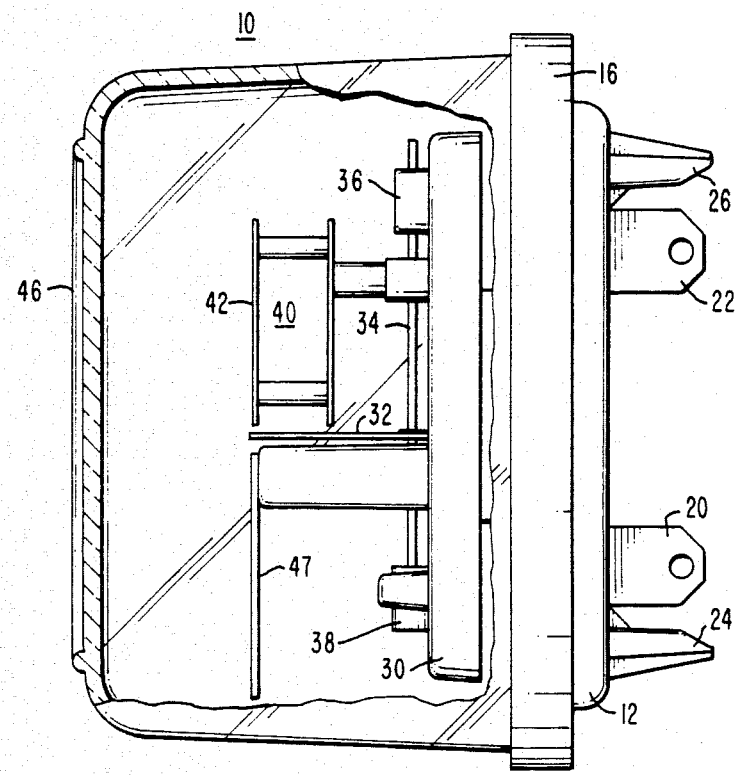
FIG. 1 illustrates a typical conventional kilowatt-hour meter.

Throughout the description of the preferred embodiment, like reference numerals will be used to describe like components in all of the Figures. The preferred embodiment of the present invention will be described in terms of its use with the kilowatt hour meter. However, it should be clearly understood that the present invention is not so limited. Alternative embodiments of the present invention can be utilized in conjunction with load management terminals, metering and control transponders or other types of electrical equipment used by electric utilities.

FIG. 1 shows an exemplary kilowatt-hour meter 10 of the type that is generally known to those skilled in the art. The meter 10 comprises a base portion 12 and a cover 14. The cover 14 is generally made of a transparent material, such as glass or plastic. The cover 14 is provided with a rim 16 around its open end that is shaped to be received in locking relation with the base 12.

The base portion 12 of the kilowatt-hour meter has two pairs of blades, 20 and 22, extending from it. These pairs of blades, 20 and 22, are shaped to be received by an electrical receptacle that is connected in electrical communication with the circuit for which electrical energy consumption is being measured. It should be understood that two pairs of blades (four blades) extend from the base 12 although all four blades are not visible in FIG. 1. A portion of the base 12 is extended outward as lugs, 24 and 26, for the purpose of protecting the blades and aiding in alignment when the meter 10 is inserted into a receptacle. Of course, it should be understood that the present invention is not limited to use with pluggable meters. The present invention could alternatively be utilized with integral or surface mounted apparatus.

The kilowatt-hour meter 10 is provided with a frame 30 that is rigidly attached to its base 12. The frame 30 is a metallic structure that provides sufficient strength and rigidity to support the operative components of the kilowatt-hour meter 10. The frame 30 is generally made of a nonmagnetic die-cast material, such as aluminum, and provides support for the various moving and stationary parts of the kilowatt-hour meter 10. U.S. Pat. No. 3,309,152 which issued to Ramsey et al. on Mar. 14, 1964 discloses a type of kilowatt-hour meter 10 and is hereby incorporated by reference. Since kilowatt-hour meters are known to those skilled in the art, the specific functions and interrelationships of the various components illustrated in FIG. 1 will not be described in detail.

When used to measure the electrical energy consumed by an electrical circuit, AC electric energy is supplied to the kilowatt-hour meter 10 via terminal blade pairs 20 and 22. The AC electrical energy is directed to an electromagnet unit (not shown in FIG. 1) as described in the above-mentioned U.S. Pat. No. 3,309,152. The electromagnet unit includes a voltage section having a voltage winding carried by an E-shaped laminated core and a current section including a pair of current coils carried by a C-shaped laminated core. The voltage and current sections direct AC driving magnetic fluxes across an air gap of the electromagnet unit and through a rotatable electroconductive disk 32. The disk 32 is carried on a vertical shaft 34. The shaft 34 is supported at its upper end by an upper bearing support 36 and at its lower end by a lower bearing support 38. The upper bearing support 36 and the lower bearing support 38 are supported by the frame 30. These portions of the kilowatt-hour meter 10 are described in U.S. Pat. No. 3,143,704 which issued to Wright on Aug. 4, 1964; U.S. Pat. No. 3,413,550 which issued to Wright on Nov. 26, 1968; U.S. Pat. No. 3,693,086 which issued to Redecker et al. on Sept. 19, 1972 and U.S. Pat. No. 3,810,683 which issued to Zisa et al. on May 14, 1974.

A driving torque is produced in the disk 32 by an interaction of eddy currents with the driving magnetic fluxes inducing the eddy currents. This phenomenon is well understood by those skilled in the art of kilowatt-hour meters. A dial register 40 is operatively connected to the shaft 34 by a series of gears and shafts (not illustrated in FIG. 1). Dial indicators on the front face 42 of the dial register 40 rotate in response to the rotation of the disk 32. The dial indicators are disposed on shafts that extend through the front face 42 of the register 40. The rotation of these dial indicators (not shown in FIG. 1), in cooperation with indicia disposed on the front face 42, permit an observer to view the meter reading through the front surface 46 of the cover 14.

The kilowatt hour meter 10 is also generally provided with a nameplate 47 which is used to indicate the meter's configuration or style along with its part number. The nameplate 47 in FIG. 1 is illustrated as a generally flat plate. However, it should be understood that, depending on the size and shape of various other components of the kilowatt hour meter 10, other nameplate shapes could be utilized.

The purpose of the present invention is to permit a kilowatt-hour meter, such as the meter 10, to be easily upgraded by the addition of auxiliary electronic components without adversely affecting the operation of the conventional meter or requiring significant changes to its existing components.

Figure 2:
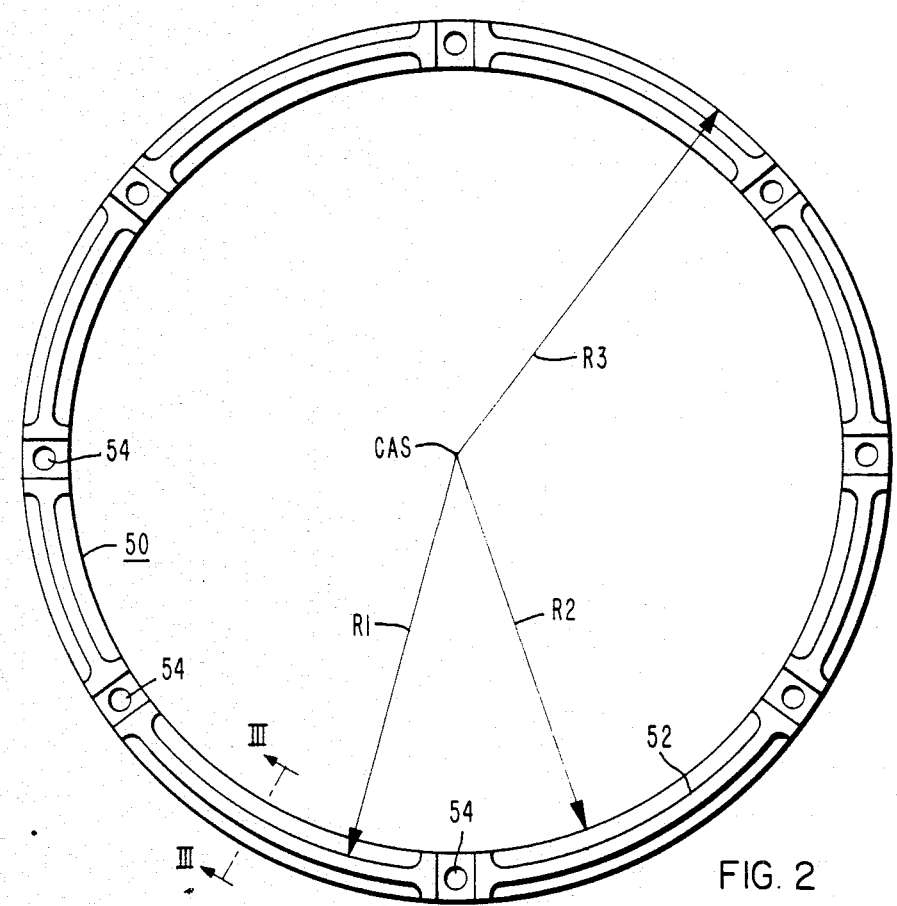
FIG. 2 illustrates a base ring of the present invention.

The present invention comprises a base ring 50 as illustrated in FIG. 2. The base ring 50 provides a means for attaching the support structure of the present invention to the base portion 12 of a conventional kilowatt-hour meter. In a preferred embodiment of the present invention, the base ring 50 is made of a nonmetallic material, such as plastic and is generally circular with a central axis of symmetry CAS that is perpendicular to the illustration of FIG. 2. It has a central raised portion 52 and a plurality of holes 54. It should be understood that, although the base ring 50 is illustrated in FIG. 2 and described herein as having a central axis of symmetry CAS the positions of the holes 54 are not necessarily disposed about the ring in the manner that would position them symmetrical about the ring's center, or equally spaced. The arcuate spacing of the holes 54 is chosen to accommodate the locations of various portions of the meter base and frame with which the latches, which will be described in detail below, can cooperate to fasten the base ring 50 to the kilowatt hour meter. The raised portion 52, in a preferred embodiment of the present invention, serves two purposes. First, it provides added strength to the base ring 50. Second, as will be described in greater detail below, it provides a ridge with which a portion of the latches can cooperate to restrict potential loosening of the latches after installation. The holes 54 provide a means for attaching a plurality of posts, which will be discussed in greater detail below, to the base ring 50 and also provide a means for attaching a plurality of latches, which will be discussed in detail below, to the base ring 50 for the purpose of rigidly attaching the support structure of the present invention to the frame 30 and base portion 12 of a conventional kilowatt-hour meter.

In FIG. 2, three radii are illustrated. These radii, R1, R2 and R3, will be used throughout the discussion below to more clearly relate the dimensional relationship between the components of the present invention and the base portion 12 of a kilowatt-hour meter.

Figure 3:
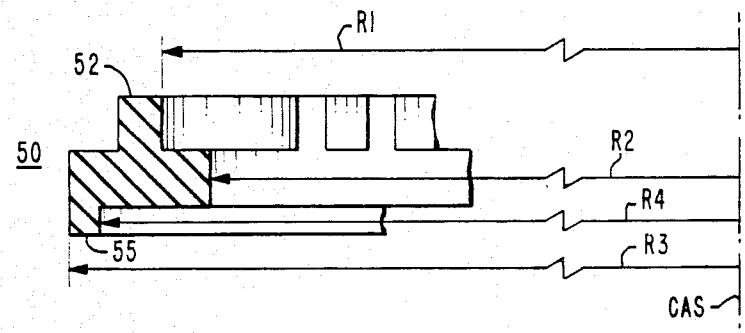
FIG. 3 is an enlarged sectional view of the base ring of FIG. 2.

FIG. 3 illustrates a cross sectional view of the base ring 50 of FIG. 2. FIG. 3 shows the outside radial dimension R3, the inside radial dimension R2 and the inside radial dimension R1 of the raised portion 52 of the base ring 50. Also shown in FIG. 3, is a ridge 55 that extends from the base ring 50 in an opposite direction from the raised portion 52. When the base ring 50 is associated with the base portion 12 of a kilowatt-hour meter, the ridge 55 is received between two circular raised portions of the meter base. The inside radial dimension of the ridge 55 is illustrated by arrow R4. The preferred embodiment of the present invention is illustrated and described herein as being associated with a kilowatt hour meter whose base is provided with the two circular raised portions discussed above. It should be clearly understood that some meter bases and the bases for load management terminals and metering and control transponders do not incorporate these circular raised portions. The precise cross sectional shape of the base ring 50 in a preferred embodiment of the present invention is chosen to take advantage of the existence of these circular raised portions. However, if these circular raised portions are not available on the electrical apparatus with which the present invention is used, alternative types of base portions can be provided that are shaped to be received in such a way so as to prevent relative motion between the base of the electrical apparatus and the base portion of the present invention.

Figure 4A:
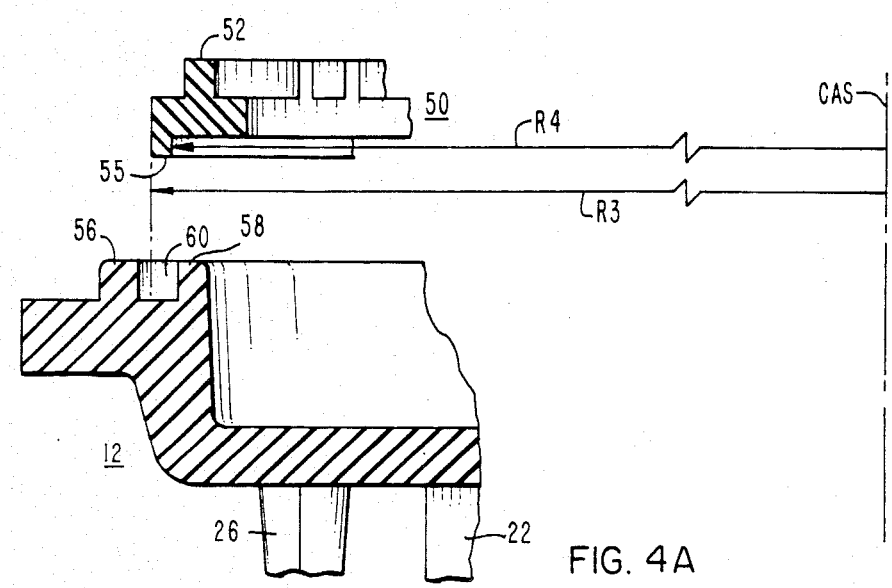
FIG. 4A shows a base ring of the present invention in comparison to the base portion of a conventional kilowatt-hour meter.

FIG. 4A illustrates the relationship between the base ring 50 of the present invention and the base portion 12 of a conventional kilowatt-hour meter. The base portion 12 of the meter is shown with its blade 22 and lug 26 extending from it. The base portion 12 of the meter has two circular raised portions, 56 and 58, that combine to define a circular groove 60. The ridge 55 of the base ring 50 is shaped to be received into the groove 60 of the base portion 12. When the ridge 55 is disposed in the groove 60, the movement of the base ring 50 is limited in all directions except in a circular direction about its central axis of symmetry and in a direction directly away from the base 12. It should be understood that, although the preferred embodiment of the present invention is described in terms of a ridge 55 that is shaped to be received in a groove 60, other shapes of the base 12 and base ring 50 could alternatively be used to permit these components to be aligned in a motion restricting relation.

Figure 4B:
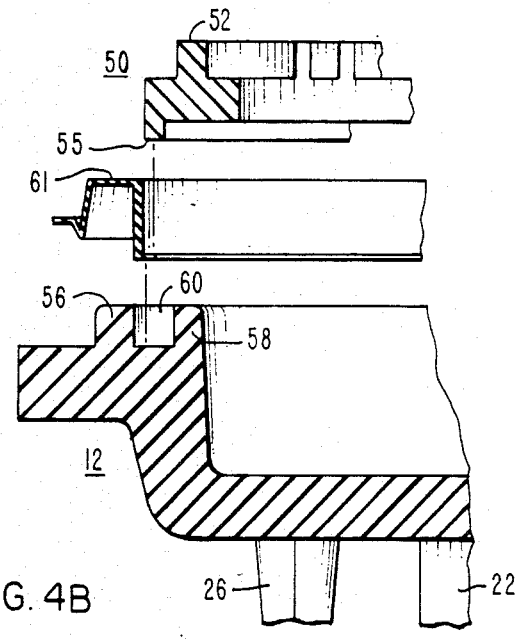
FIG. 4B is similar to FIG. 4A, but also illustrates a gasket disposed between the base ring of the present invention and the meter base.

FIG. 4B is similar to FIG. 4A, but also illustrates the presence of a gasket 61 disposed between the circular rings, 56 and 58, and the ridge 55 of the base ring 50. It should be understood that the gasket 61 is not a requirement of the present invention. Rather, the gasket 61 is a normal inclusion between the base 12 and the cover 14 of a typical kilowatt-hour meter.

Figure 5:
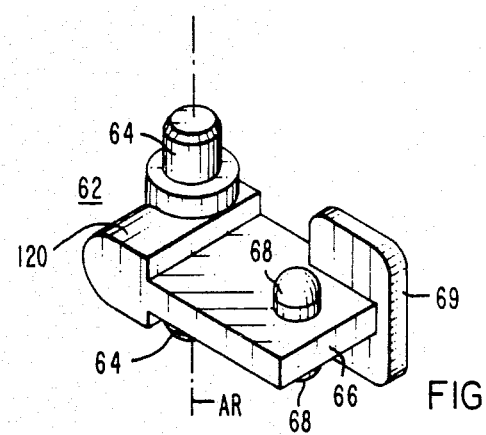
FIG. 5 shows a latching device used in cooperation with the base ring of the present invention in order to secure it to a conventional kilowatt-hour meter base structure.

FIG. 5 illustrates a latch 62 of the present invention. The latch 62 is provided with a rod shaped portion 64 that is shaped to be received by one of the plurality of holes 54 of the base ring 50. When inserted into a hole of the base ring, the latch 62 has an axis of rotation AR as shown. The latch 62 has a platform portion 66 from which a protrusion 68 extends. Although only one protrusion 68 is shown extending from the upper surface of the platform portion 66, it should be understood that a similar protrusion extends downward from the lower surface of the platform portion 66. The latch 62 is also provided with a handle, or stop 69. When the latch 62 is rotated about its axis of rotation AR, the lower protrusion 68 passes over the ridge 52 of the base ring 50 and prevents the latch 62 from rotating in a reverse, or unlatching, direction. The raised body 120, when the latch 62 is rotated radially inward, provides the latch portion of the latch 62. In other words, the raised body 120 protrudes into the space between the frame 30 and the base 12. The edge of platform 66 abuts against a component of the meter in such a way so as to prevent rotation of the base ring 50 about its central axis of symmetry CAS. Since this type of abutment can prevent rotation in one angular direction, two or more latches 62 are normally used to assure that no rotation of the base ring 50 can occur. The stop 69, in a preferred embodiment of the present invention, abuts against the raised portion 52 of the base ring 50 and, in some cases, against the frame 30 of the meter. Therefore, the stop 69 prevents the latch 62 from rotating about its axis of rotation AR to an excessive amount. The stop 69 of the present invention thus positions the platform portion 66 in a proper attitude for abutment against a portion of the meter structure under the frame 30. The stop 69 also serves a useful purpose in providing a means for manually manipulating the latch 62. It facilitates finger manipulation of the latch 62 about its axis of rotation AR and provides a surface against which manual pressure can be applied during the latching procedure.

Figure 6:
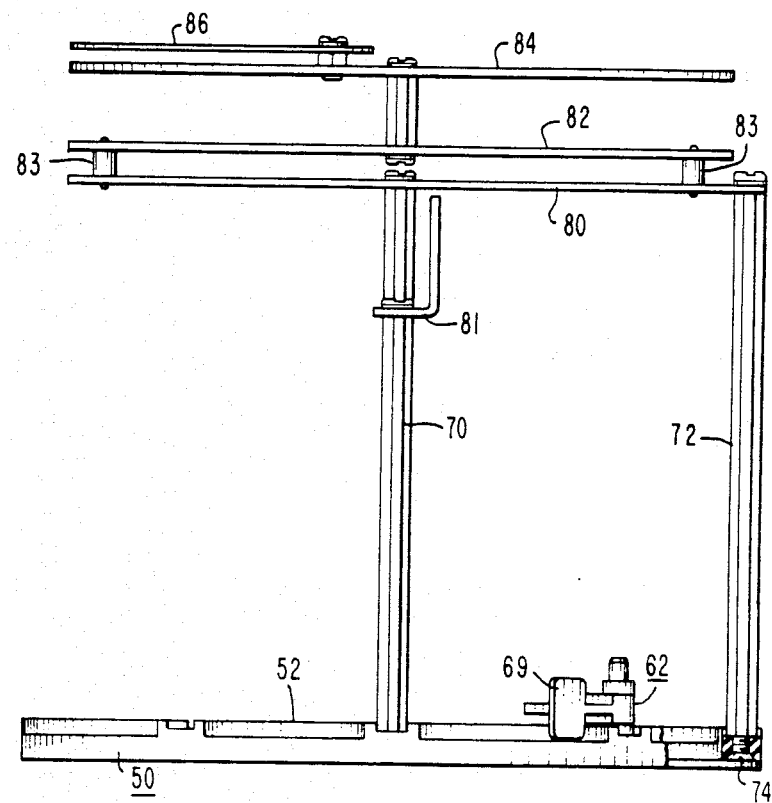
FIG. 6 illustrates the support structure of the present invention.

FIG. 6 illustrates the support structure of the present invention. The base ring 50 is shown with a latch 62 connected to it. Two posts, 70 and 72, are shown extending from the base ring 50. Although only two posts, 70 and 72, are illustrated in FIG. 6, it should be clearly understood that more than two posts can be utilized. In a typical application of the present invention, three posts would probably be incorporated in order to provide a three point mounting between the base ring 50 and the various support plates attached to the posts. Depending on rigidity requirements, various numbers of posts can be employed. One end of each of these posts is connected to the base ring 50 and the posts, 70 and 72, extend from the base ring 50 in a direction that is generally parallel to the central axis of symmetry of the base ring 50. In a preferred embodiment of the present invention, the posts, 70 and 72, are made of a hexagonal rod with each end being drilled and tapped to receive a screw. As can be seen in FIG. 6, post 70 is slightly shorter than post 72. This characteristic of the posts is not a requirement of the present invention. Rather, the exact dimensions of the post are a function of the particular application in which the present invention is used. The posts, 70 and 72, are attached to the base ring 50 by screws 74 which extend through holes in the base ring 50 and into the posts.

Attached to the posts, 70 and 72, is a support plate 80. The support plate 80 extends in a direction which is generally perpendicular to the central axis of symmetry of the base ring 50. The primary function of the support plate 80 is to provide a means for mounting auxiliary electronic components for the purpose of expanding the capabilities of the kilowatt-hour meter with which the support structure of FIG. 6 is used. Although support plate 80 is illustrated in FIG. 6 as being a simple flat plate, it should be understood that in a typical application of the present invention, this plate would most likely be a printed circuit board. It should further be understood, however, that the precise types of components used as support plates with the present invention can vary significantly. They can comprise circuit boards, metallic support plates or other types of structures that are designed to fulfill a specific function required by the auxiliary equipment that is being added to the existing electrical apparatus.

In applications where the support plate 80 is a printed circuit board, such as a power amplifier circuit board, a heat sink 81 would generally be attached to it. In this particular type of application of the present invention, the component illustrated by reference numeral 82 would be a logic circuit board that is held to the powered amplifier circuit board 80 via a plurality of plastic snap-in fasteners 83. In one particular embodiment of the present invention, support plate 84 is metallic and contains printed information relative to the specific functions, style and part numbers of the electronic subassembly. The plate indicated by reference numeral 86 would contain printed information regarding the style and part numbers of the meter with which the present invention is associated in a particular application.

Other support plates 82 and 84 are also illustrated in FIG. 6. It should be understood that the precise configuration and association of these support plates, 80, 82 and 84, can vary significantly based on the particular application of the present invention.

Figure 7:
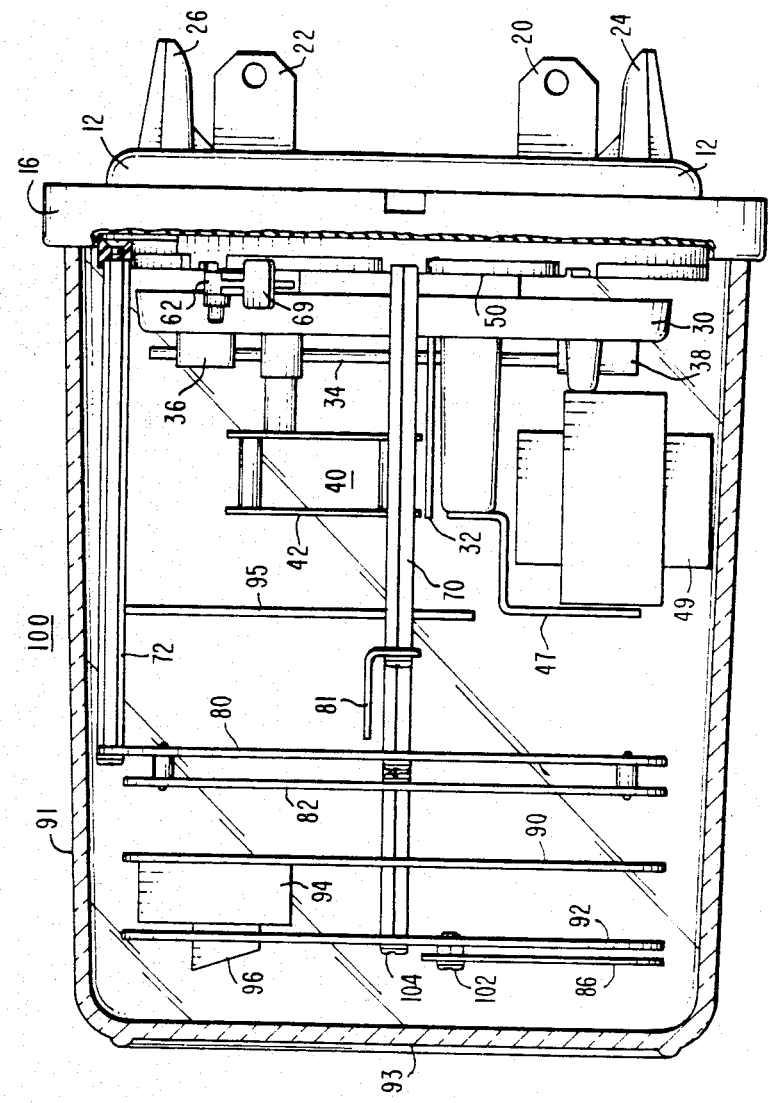
FIG. 7 shows the present invention used in conjunction with a kilowatt-hour meter in order to provide support for auxiliary components for the meter.

The present invention will be more fully understood by comparing the conventional meter of FIG. 1 to the meter of FIG. 7 which includes the present invention. FIG. 7 illustrates a conventional kilowatt-hour meter that has been upgraded by the addition of the present invention. Prior to the addition of the present invention, the kilowatt-hour meter 100, illustrated in FIG. 7, comprised the basic elements of the kilowatt-hour meter 10 of FIG. 1. More specifically, prior to being upgraded, the kilowatt-hour meter of FIG. 7 comprises the base 12, the frame 30, the rotatable disk 32 and its shaft 34, the register 40 with its faceplate 42 and the related components which are illustrated in both FIGS. 1 and 7. In order to upgrade the kilowatt-hour meter 10 to the improved kilowatt-hour meter 100, a base ring 50 with its associated posts, 70 and 72, and its plurality of support plates, is connected to the base 12 of the kilowatt-hour meter by aligning the ridge (reference numeral 54 in FIG. 4) with the slot (reference numeral 60 in FIG. 4) and rotating a plurality of latches (reference numeral 62 in FIGS. 5, 6 and 7) in such a way that the raised body (reference numeral 120 in FIG. 5) exerts a force against the frame 30 in a direction away from the base 12. This force results in an equal opposing force which pushes the base ring 50 against the base portion 12 of the meter. This action of the latches 62 effectively attaches the present invention to the base 12 and, as discussed above, the latches 62 also prevent rotation of the base ring 50 about its central axis of symmetry. The posts, 70 and 72, extend in a direction away from the base 12 as shown in FIG. 7. A plurality of support plates, 80, 82, 90, 92 and 95 are attached to the posts in such a way that they are disposed in a direction which is generally perpendicular to the central axis of symmetry of the base ring 50. The plurality of support plates provide support for additional electronic components and circuitry that are used in updating the capabilities of the subject kilowatt-hour meter.

When the present invention is used to upgrade existing electrical equipment, various types of electronic components can be added to the kilowatt-hour meter. For example, a kilowatt-hour meter can be upgraded to include time of use metering, rolling demand metering, LED rate indication, load survey devices or operational relay coils along with many other alternative components.

Also shown in FIG. 7 is an electronic display 94 with its bezel 96. The inclusion of an electronic display 94 is another one of the optional capabilities provided by the support structure of the present invention. However, it should be understood that the specific electronic components added to the meter and supported by the present invention do not, by themselves, relate directly to the requirements of the present invention. The primary purpose of the support structure of the present invention is to provide a means for supporting various kinds of auxiliary electronic components to an existing kilowatt-hour meter.

In a preferred embodiment of the present invention, the support plates are provided with an opening therethrough to enable an observer to visually observe the front plate 42 of the register 40. Even though an additional electronic register 94 is shown attached to the present invention in FIG. 7, it should be understood that in certain circumstances, it is desirable to also provide the capability of viewing the existing mechanical register 40. In order to provide this capability, openings must be provided in all of the support plates that lie between the front surface 93 of the cover 91 and the indicia portion of the front plate 42 of the register 40. This capability will be discussed in greater detail below in relation to the frontmost support plate 92. Of course it should be understood that in applications that do not include existing registers that are visually readable, openings in the support plates of the present invention are not required. This particular feature is merely provided in order to allow an operator to visually observe a register by looking through the openings of the present invention and this feature is only provided when it is necessary.

By comparing FIGS. 1 and 7, it should be apparent that an elongated cover 91 replaces the existing cover 14 of the kilowatt-hour meter. An elongated cover is a requirement when the support plates and posts of the present invention extend away from the base portion 12 by a dimension greater than the original cover 14 would otherwise permit.

Figure 8:
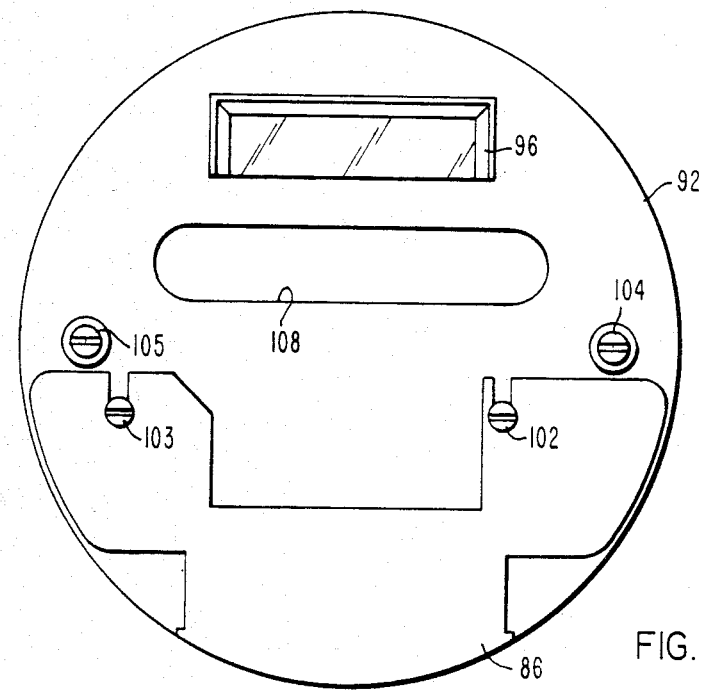
FIG. 8 illustrates a support plate of the present invention.

FIG. 8 illustrates a frontal view of the front most support plate 92. As can be seen in FIG. 8, this support plate 92 has an opening 108 through which the front plate 42 and its dial indicators can be observed through the front surface 93 of the cover 91. Screws 104 and 105 connect the support plate 92 to the posts and spacers which provide rigid attachment of the support plate 92 to the other components of the present invention. The plate 86 is detachable from the support plate 92 and is held in place by screws, 102 and 103. The plate 86 is not an absolute requirement of the present invention, but permits descriptive indicia to be added to the front portion of support plate 92. Typical information that could be contained on the front surface of plate 86 include the class, voltage, serial number, style number and other related information that is descriptive of the updated kilowatt-hour meter 100.

Viewing FIGS. 7 and 8 together, it should be apparent that each of the support plates illustrated between the register 40 and the front surface 93 of the cover 91 also have an opening through them. These openings are generally similar in shape to opening 108 and are aligned in such a way so as to permit an observer to view the front plate 42 of the register 40 through the front surface 93 of the meter cover.

The advantages of the present invention can be seen in the illustration of FIG. 7. The present invention, with all of its added electronic components, can be manufactured as a separate subassembly prior to delivering it to an existing kilowatt-hour meter in the field. However, it should be clearly understood that a more typical application of the present invention is the upgrading of kilowatt-hour meters during original manufacturing. For example, if a manufacturer produces a basic kilowatt-hour meter and also offers a more sophisticated kilowatt-hour meter that employs additional electronic components, the more sophisticated units can be manufactured by utilizing the basic kilowatt-hour meter along with the present invention. This permits the manufacturer to avoid the necessity of producing and storing two different styles of kilowatt-hour meters. Instead, the basic kilowatt-hour meter can be manufactured in sufficient quantities for use as both the basic kilowatt-hour meter and a portion of the more sophisticated kilowatt-hour meter that would be combined with the present invention in order to provide the additional electronic components that are necessary in the more sophisticated meter. Therefore, it should be understood that the present invention can be used by meter manufactures in order to simplify the upgrading of kilowatt-hour meters during original manufacture or, alternatively, can be used to upgrade existing meters that are already installed at consumers' residences. The additional electronic components would be mounted on the present invention for later attachment to kilowatt-hour meters. Electrical connections can easily be provided by flexible ribbon cable (not illustrated in FIG. 7) which would be precisely shaped to conform to the specific electronic components that are attached to the support plates of the present invention.

Installation of the present invention will be more fully understood by comparing FIGS. 1 and 7. In order to convert the kilowatt-hour meter 10 of FIG. 1 to the upgraded kilowatt-hour meter 100 of FIG. 7, the cover 14 would be removed from the base portion 12. Then, support structure of the present invention (as illustrated in FIG. 6), with all auxiliary electronic equipment attached to its support plates, would be positioned over the existing components of the kilowatt-hour meter 10 and its base ring 50 would then be placed against the base portion 12 with its ridge (reference numeral 54 in FIG. 4) inserted into the groove (reference numeral 60 of FIG. 4) of the base portion 12. Prior to latching the present invention to the existing meter base and frame 30, it can be rotated about its central axis of symmetry in order to properly align the auxiliary components attached to it with the existing components of the original kilowatt-hour meter 10. After being thus aligned, the latches 62 can be rotated by hand to rigidly attach the base ring 50 between the base portion 12 of the kilowatt-hour meter and its frame 30 and prevent rotation of the base ring 50. By rotating the latches 62, the base ring 50 and its associated posts and support plates are fixedly attached to the base portion 12 of the kilowatt-hour meter. After making the necessary electrical connections, the elongated cover 91 is connected in locking relation with the base portion 12. Other than its elongated shape, the cover 91 is similar to the cover 14 and to the many covers known to those skilled in the art for use with kilowatt-hour meters. In fact, the elongated cover 91 can usually be the cover that is typically used on polyphase meters. The cover and rim are generally a single assembly.

Referring again to FIG. 7, it can be seen that the base ring 50 and the posts, 70 and 72, are arranged radially around the central axis of symmetry of the support ring 50 in such a way so as to permit the support structure of the present invention to pass over the existing components (illustrated in FIG. 1) without interfering with them. The posts, 70 and 72, support the plurality of support plates away from the existing components and enable the present invention to provide auxiliary equipment for use with the existing kilowatt-hour meter without adversely affecting its operation.

The present invention permits existing kilowatt-hour meters to be upgraded by adding auxiliary electronic equipment. The auxiliary equipment can be manufactured as a single unit, along with the support structure of the present invention, and delivered to the field installation for upgrading the meter. Flexible ribbon connectors can be used to provide necessary electrical connections between old components and auxiliary components and the openings through the support plates of the present invention avoid obstruction of view between the front surface of the meter cover and the original register.

Although the preferred embodiment of the present invention has been described in considerable detail and with particular exemplary structures, it should not be considered to be so limited. Alternative combinations of support plates and posts along with a modified support ring should be considered to be within the scope of the present invention.

I claim:

1. An electrical apparatus, comprising:
a base;
a support structure comprising a base ring, a plurality of posts and support plate, said base ring having a central axis of symmetry and being removably attachable to said base ring, each of said plurality of posts having one end connected to said base ring, said support plate being attached to at least one of said plurality of posts, and being generally perpendicular to said plurality of posts, said posts being disposed on the base ring in a radial pattern about the central axis of symmetry of the base ring in such a way as to permit the support structure to pass over and beyond existing components mounted on the base; and
means for removably attaching said base ring to said base, said attaching means comprising a plurality of latches, each of said plurality of latches having an axis of rotation and being shaped to be received in rotatable association with said base ring to removably attach said base ring to said base.

2. The apparatus of claim 1, wherein:
said electrical apparatus is an electrical meter and said base is shaped to be mounted on a vertical surface.

3. The apparatus of claim 1, wherein:
said support plate has an opening therethrough, said opening being aligned with a component of said electrical apparatus.

4. The apparatus of claim 3, wherein:
said component of said electrical apparatus is a register.

5. The apparatus of claim 1, further comprising:
a cover disposed over said support plate, said posts and said base ring, said cover being attached to said base.

6. The apparatus of claim 1, wherein:
said support plate is a circuit board.

7. An electric meter, comprising:
a base,
a frame attached to said base, said frame being associated with said base to define a gap between said frame and said base;
a first register attached to said frame, said first register having a plurality of dial indicators, each of said dial indicators being attached to a rotatable shaft, said first register having a faceplate with indicia disposed thereon, said dial indicators being associated with said indicia to represent a measured quantity;
a base ring shaped to fit in rotatable association with said base, said base ring having a central axis of symmetry;
a plurality of latches rotatable attached to said base ring, each of said latches having a latch portion shaped to fit within said gap upon rotation of its associated latch about its center of rotation, said latches being configured to exert a force against said frame when said latch portions are rotated into said gap, said force being in a direction away from said base and resulting in a force against said base ring in a direction toward said base;
a plurality of posts, each of said posts having one end attached to said base ring and extending in a direction away from said base;
a mounting plate attached to at least one of said posts, said mounting plate being disposed in a generally perpendicular association with said central axis of symmetry of said base ring, said mounting plate having an opening therethrough, said opening being generally aligned with said indicia along a line generally parallel to said central axis of symmetry of said base ring; and
a cover attachable to said base, said cover having a transparent portion aligned with said opening and said indicia.

8. The meter of claim 7, further comprising:
electronic components attached to said mounting plate, said electronic components being connected in electrical communication with other electronic components attached to said base by a flexible conductor.

9. The meter of claim 7, further comprising
a second register attached to said mounting plate, said second register being an electronic display device that is connected in electrical communication with a pulse initiator, said pulse initiator being operatively associated with electrical energy measuring apparatus attached to said base.

* * * * *